(12) United States Patent
Benmouyal et al.

(10) Patent No.: US 8,140,283 B2
(45) Date of Patent: Mar. 20, 2012

(54) INDEPENDENT FREQUENCY MEASUREMENT AND TRACKING

(75) Inventors: Gabriel Benmouyal, Boucherville (CA); Angelo D'Aversa, Lafayette Hills, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 329 days.

(21) Appl. No.: 12/343,734

(22) Filed: Dec. 24, 2008

(65) Prior Publication Data

US 2010/0161263 A1 Jun. 24, 2010

(51) Int. Cl.
*G01R 23/02* (2006.01)
*G01R 19/252* (2006.01)
(52) U.S. Cl. ....... 702/72; 702/75; 324/76.42; 324/76.39
(58) Field of Classification Search ..................... 702/72
See application file for complete search history.

(56) References Cited

U.S. PATENT DOCUMENTS

| | | |
|---|---|---|
| 4,636,909 A | 1/1987 | Brandt |
| 4,672,501 A | 6/1987 | Bilac |
| 4,715,000 A | 12/1987 | Premerlani |
| 4,829,298 A | 5/1989 | Fernandes |
| 5,006,846 A | 4/1991 | Granville |
| 5,224,011 A | 6/1993 | Yalla |
| 5,398,029 A | 3/1995 | Toyama |
| 5,446,682 A | 8/1995 | Janke |
| 5,498,956 A | 3/1996 | Kinney |
| 5,592,393 A | 1/1997 | Yalla |
| 5,721,689 A * | 2/1998 | Hart et al. ................ 702/75 |
| 5,805,395 A | 9/1998 | Hu |
| 5,809,045 A | 9/1998 | Adamiak |
| 5,995,911 A | 11/1999 | Hart |
| 6,141,196 A | 10/2000 | Premerlani |
| 6,148,267 A | 11/2000 | Premerlani |
| 6,236,949 B1 | 5/2001 | Hart |
| 6,311,307 B1 | 10/2001 | Adamiak |
| 6,313,614 B1 * | 11/2001 | Persson et al. ................ 323/255 |
| 6,366,864 B1 * | 4/2002 | Kulidjian et al. ............... 702/60 |
| 6,426,856 B1 | 7/2002 | Schneerson |
| 6,446,682 B1 | 9/2002 | Viken |
| 6,456,947 B1 | 9/2002 | Adamiak |
| 6,571,182 B2 | 5/2003 | Adamiak |
| 6,603,298 B2 | 8/2003 | Guzman-Casillas |
| 6,662,124 B2 | 12/2003 | Schweitzer, III et al. |
| 6,717,394 B2 * | 4/2004 | Elms .......................... 324/76.39 |

(Continued)

OTHER PUBLICATIONS

D. Hart et al., "A New Tracking and Phasor Estimation Algorithm for Generator", IEEE Transaction on Power Delivery, vol. 12, No. 3, pp. 1064-1073, Jul. 1997.*

(Continued)

*Primary Examiner* — Michael Nghiem
*Assistant Examiner* — Alexander Satanovsky
(74) *Attorney, Agent, or Firm* — Richard M. Edge (57) ABSTRACT

Independent frequency measurement and tracking of a signal using a measurement interval where the frequency of the signal is measured and a sampling rate is calculated, and a settling interval where the frequency of the signal is not measured. The sampling rate is calculated to correspond with the frequency of the signal and updated only after the calculation of the sampling rate in the measuring interval. The signal may be a signal of an electric power system such as a voltage waveform or a current waveform. The frequency calculation may include determination of a rate of rotation of a positive-sequence phasor of the signal.

31 Claims, 8 Drawing Sheets

U.S. PATENT DOCUMENTS

| | | | |
|---|---|---|---|
| 6,845,333 | B2 | 1/2005 | Anderson |
| 6,934,654 | B2 | 8/2005 | Benmouyal |
| 7,328,114 | B2 | 2/2008 | Premerlani |
| 2001/0012984 | A1 | 8/2001 | Adamiak |
| 2004/0186669 | A1 | 9/2004 | Benmouyal |
| 2006/0069522 | A1* | 3/2006 | Bruno .......................... 702/72 |
| 2006/0247874 | A1* | 11/2006 | Premerlani et al. .......... 702/64 |
| 2007/0008033 | A1 | 1/2007 | Okazaki |
| 2007/0086134 | A1 | 4/2007 | Zweigle |
| 2007/0136013 | A1* | 6/2007 | Premerlani et al. .......... 702/75 |
| 2009/0254291 | A1 | 10/2009 | Benmouyal |

OTHER PUBLICATIONS

T. T Sezi, "A New Method for Measuring Power System Frequency", IEEE Transmission and Distribution, vol. 1, pp. 400-405, IEEE, 1999.*

D. Hart et al., "A New Tracking and Phasor Estimation Algorithm for Generator", IEEE Transaction on Power Delivery, vol. 12, No. 3, pp. 1064-1073, Jul. 1997.*

T. Sezi, "A New Method for Measuring Power System Frequency", IEEE Transmission and Distribution, vol. 1, pp. 400-405, IEEE, 1999.*

Maohai Wang, Yuanzhang Sun, A Practical, Precise Method for Frequency Tracking and Phasor Estimation, IEEE Transactions on Power Delivery, vol. 19, No. 4, Oct. 2004.

Gabriel Benmouyal, An Adaptive Sampling-Interval Generator for Digital Relaying, IEEE Transactions on Power Delivery, vol. 4, No. 3, Jul. 1989.

Gabriel Benmouyal, Removal of DC-Offset in Current Waveforms Using Digital Mimic Filtering, IEEE Transactions on Power Delivery, vol. 10, No. 2, Apr. 1995.

Bijoy Chattopadhyay, Chavdar Ivanov, M.S. Sachdev, A New Frequency Measurement Algorithm in the Presence of Harmonics Using Instantaneous Phasor Quantities, CCECE, 1996.

Daqing Hou, Relay Element Performance During Power System Frequency Excursions, Aug. 2007.

P.J. Moore, J.H. Allmeling, A.T. Johns, Frequency Relaying Based on Instantaneous Frequency Measurement, IEEE, 1996.

A.G. Phadke, J.S. Thorp, M.G. Adamiak, A New Measurement Technique for Tracking Voltage Phasors, Local System Frequency, and Rate of Change of Frequency, IEEE Transactions on Power Apparatus and Systems, 1983.

M.S. Sachdev, M.A. Baribeau, A New Algorithm for Digital Impedance Relays, IEEE Transactions on Power Apparatus and Systems, vol. PAS-98, No. 6, Nov./Dec. 1979.

E.O. Schweitzer, III, Daqing Hou, Filtering for Protective Relays, 47th Georgia Tech Protective Relaying Conference, Apr. 28-30, 1993.

Tevfik Sezi, A New Method for Measuring Power System Frequency, NWPPA Engineering and Operations Conference, Spokane, WA, Apr. 17-21, 2000.

T.S. Sidhu, M.S. Sachdev, An Iterative DSP Technique for Tracking Power System Frequency and Voltage Phasors, IEEE, 1996.

Gerard Stenbakken, Tom Nelson, Ming Zhou, Virgilio Centeno, Reference Values for Dynamic Calibration of PMUs, Proceedings of the 41st Hawaii International Conference on System Sciences, Jan. 7, 2008.

Liancheng Wang, Frequency Responses of Phasor-Based Microprocessor Relaying Algorithms, IEEE Transactions on Power Delivery, vol. 14, No. 1, Jan. 1999.

Jun-Zhe Yang and Chih-Wen Liu, A Precise Calculation of Power System Frequency and Phasor, IEEE Transactions on Power Delivery, vol. 15, No. 2, Apr. 2000.

PCT/2009/038996 International Search Report and Written Opinion of the International Searching Authority, Jun. 4, 2009.

* cited by examiner

INDEPENDENT FREQUENCY MEASUREMENT AND TRACKING

RELATED APPLICATION (none)

TECHNICAL FIELD

This disclosure relates to measuring and tracking the frequency of a signal. More particularly, this disclosure relates to sampling a signal at a sampling rate, measuring the frequency of the signal, and modifying the sampling rate corresponding to the measured frequency. The signal may be a signal from an electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

I. Overview

Electric power transmission and distribution systems typically operate at a nominal frequency (60 Hz in North America and 50 Hz in Europe and other places in the world). Protection, automation, metering, and control algorithms often depend on sampling the signals at a rate that corresponds with the actual signal frequency. The sampling rate may be an integer multiple of the nominal signal frequency. Operation of the various elements present on the electric power system (e.g. generators, various loads, capacitor banks, voltage regulators, transformers, switchgear, conductors, and the like) may cause the operating frequency of the electric power system to fluctuate. Thus, protection, automation, control, and metering algorithms that depend on sampling at a rate corresponding to the actual signal frequency may exhibit significant errors during frequency excursions from the nominal signal frequency if the sampling rate is not adjusted to correspond with the actual signal frequency.

Electric power systems are often monitored, controlled, automated, metered and/or protected using intelligent electronic devices (IEDs). IEDs are typically processor-based units that gather information from the electric power system, perform mathematical operations on the gathered information, and may take actions depending on the results of the mathematical operations. An IED may, for example, gather current and/or voltage information from an electric power system, compare it against thresholds, and communicate the results and/or cause a breaker to open, depending on the results.

Because IEDs typically perform the required mathematical operations in the digital domain (e.g. using a microprocessor, field programmable gate array (FPGA) or the like), IEDs may be configured to convert the analog electric power system signal into a digital signal using sampling, filtering, and multiplexing. As mentioned above, sampling of the electric power signal to obtain the information is often performed at a rate corresponding with the nominal or operating power system frequency.

Certain common protective algorithms performed by IEDs, however, cannot be performed accurately if the sampling of the signal is not in correspondence with the local operating frequency of the electric power system. Thus, for systems that sample at a rate corresponding with the nominal frequency, as the operating frequency of the electric power system shifts away from the nominal frequency, certain functions of the IED are not performed accurately. Such inaccurate functions may result in a misoperation of the IED, such as an opening of a circuit breaker when a fault is not present on the power system.

IEDs often use the magnitude and phase angle of the voltage and current waveforms for the three phases present on a power system in the form of complex numbers, known as phasors. To obtain phasors, IEDs may use filtering systems such as the full-cycle Fourier filter or a variation known as the Cosine filter. A waveform phasor computed using the full-cycle Fourier filter is a complex number that corresponds to:

$$X = \frac{2}{N}\sum_{k=0}^{N-1} x(k\Delta T) \cdot e^{-j\frac{2\pi k}{N}} \qquad (1.1)$$

where:
X is the voltage or current waveform phasor;
N is the number of samples in a cycle or in the data-window;
k is an index of the sample in the data-window and varies from 1 to N−1;
j is the complex operator;
ΔT is the sampling interval (equal to the inverse of the sampling frequency); and,
x(kΔT) is the voltage or current sample or instantaneous value at instant (kΔT).

A waveform phasor computed using the full-cycle Cosine filter is a complex number that corresponds to:

$$X = \frac{2}{N}\sum_{k=0}^{N-1} \left(x(k\Delta T) - jx\left[\left(k + \frac{N}{4}\right)\Delta T\right]\right) \cdot \cos\frac{2\pi k}{N} \qquad (1.2)$$

For the above filters corresponding to equations 1 and 2 to yield true and error-free magnitude and phase angle of the waveform, it is necessary to sample the waveform at a sampling frequency corresponding to the signal frequency. For example, where the waveform has a frequency of 60 Hz and is acquired at a rate (N) of 16 samples per cycle, the sampling frequency would be 960 Hz. If the sampling rate remains unchanged and the signal frequency changes, then the resulting magnitude and angle would not be error free.

One way to mitigate these errors is by frequency tracking. Under frequency tracking, the signal frequency is calculated and the sampling frequency is adjusted so that it will be equal to the number of samples in the data-window multiplied by the signal frequency. For example, when the above-described scenario drifts from 60 Hz to 59.5 Hz, the sampling rate would be adjusted to 952 Hz (16 samples per cycle multiplied by 59.5 Hz).

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

II. Example Signal Sampling Device

Figure 1:
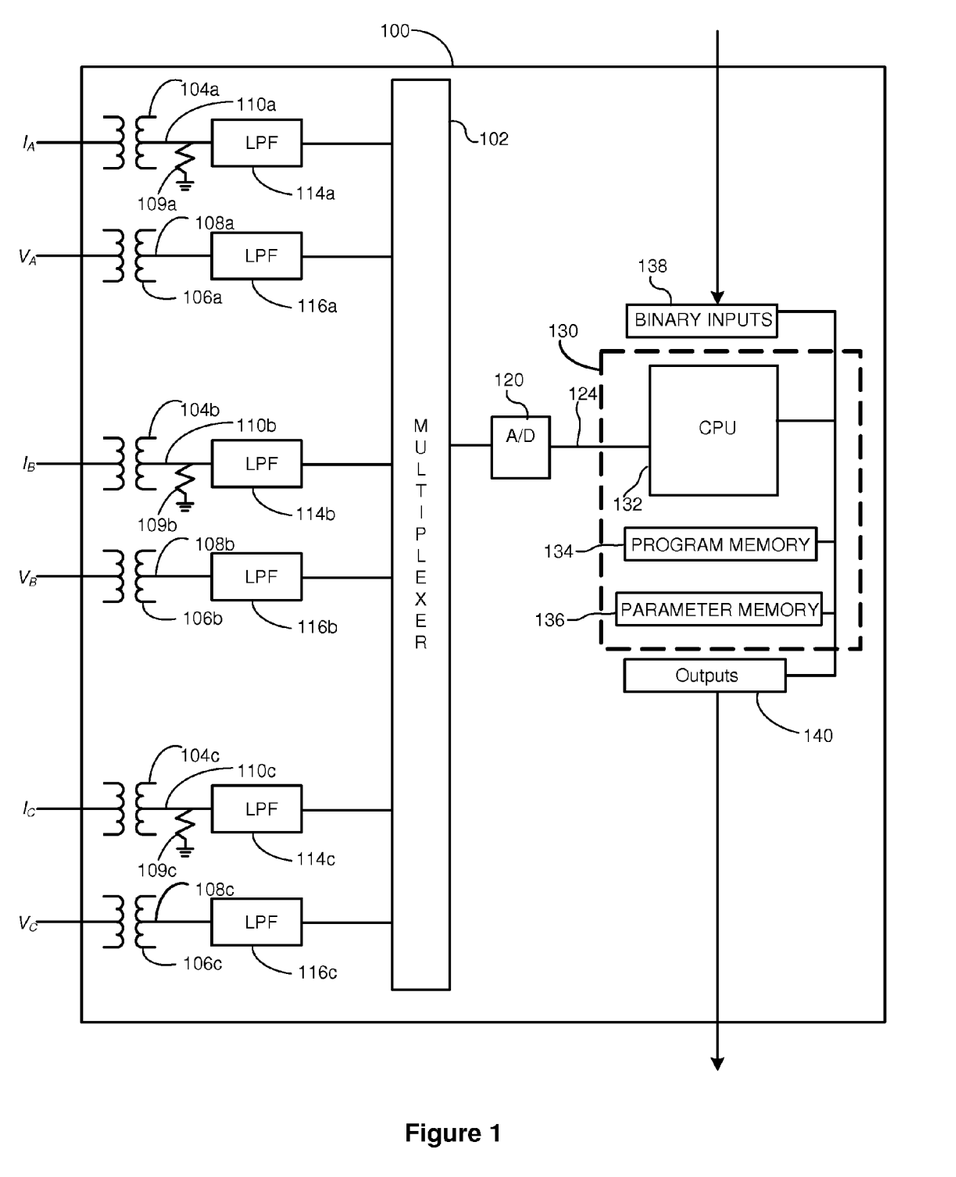
FIG. 1 is a block diagram of an intelligent electronic device for sampling a signal.

FIG. 1 is a block diagram illustrating an intelligent electronic device (IED) 100 used in a power system and configured in certain embodiments to monitor, protect, meter, and/or automate an electric power system, such as a three-phase electric power system. The IED 100 may be used, for example, in the power system's protection, automation, control, and/or metering applications to gather analog data directly from a conductor (not shown) using current transformers 104a, b, c, and/or voltage transformers 106a, b, c. The voltage transformers 106a, b, c may be configured to step-down the sensed voltage (V) to secondary voltage waveforms 108a, b, c having magnitudes that can be readily monitored and measured by the first IED 100 (e.g., to step-down the distribution line voltage from approximately 13 kV to approximately 120 V). Similarly, the current transformers 104a, b, c and resistors 109a, b, c may be configured to proportionally step-down the power system's line current (I) to secondary current waveforms 110a, b, c having a magnitude that can be readily monitored and measured by the first IED 100 (e.g., to step-down the distribution line current from approximately 200 amps to approximately 0.2 amps). Low pass filters 114a, b, c, and 116a, b, c respectively filter the secondary current waveform 110a, b, c and the secondary voltage waveform 108a, b, c. The signals are multiplexed using multiplexer 102. An analog-to-digital converter 120 then samples and digitizes the filtered waveforms to form a corresponding digitized current and voltage signals 124.

The digitized current and voltage signals 124 are received by a microcontroller 130 configured to perform digital signal processing. For example, the microcontroller 130 may use Cosine filters to eliminate DC and unwanted frequency components from the digitized current and voltage signals 124. In one embodiment, the microcontroller 130 includes a central processing unit (CPU) or microprocessor 132, a program memory 134 (e.g., a Flash EPROM), and a parameter memory 136 (e.g., an EEPROM). As will be appreciated by those skilled in the art, other suitable microcontroller configurations may be used. Further, although discussed in terms of a microcontroller, it should be noted that the embodiments disclosed herein may be practiced using a field-programmable gate array (FPGA), application specific integrated circuit (ASIC), or other programmable logic device.

The microprocessor 132, by executing a computer software program or logic scheme, processes the digitized current and voltage signals 124 to extract phasors representative of the measured secondary voltage waveform 108 and the secondary current waveform 110. The microprocessor 132 then performs various calculations and digital signal processing algorithms using the phasors. The microprocessor 132 may also provide outputs 140 based on the results of the calculations and digital signal processing.

Figure 2A:
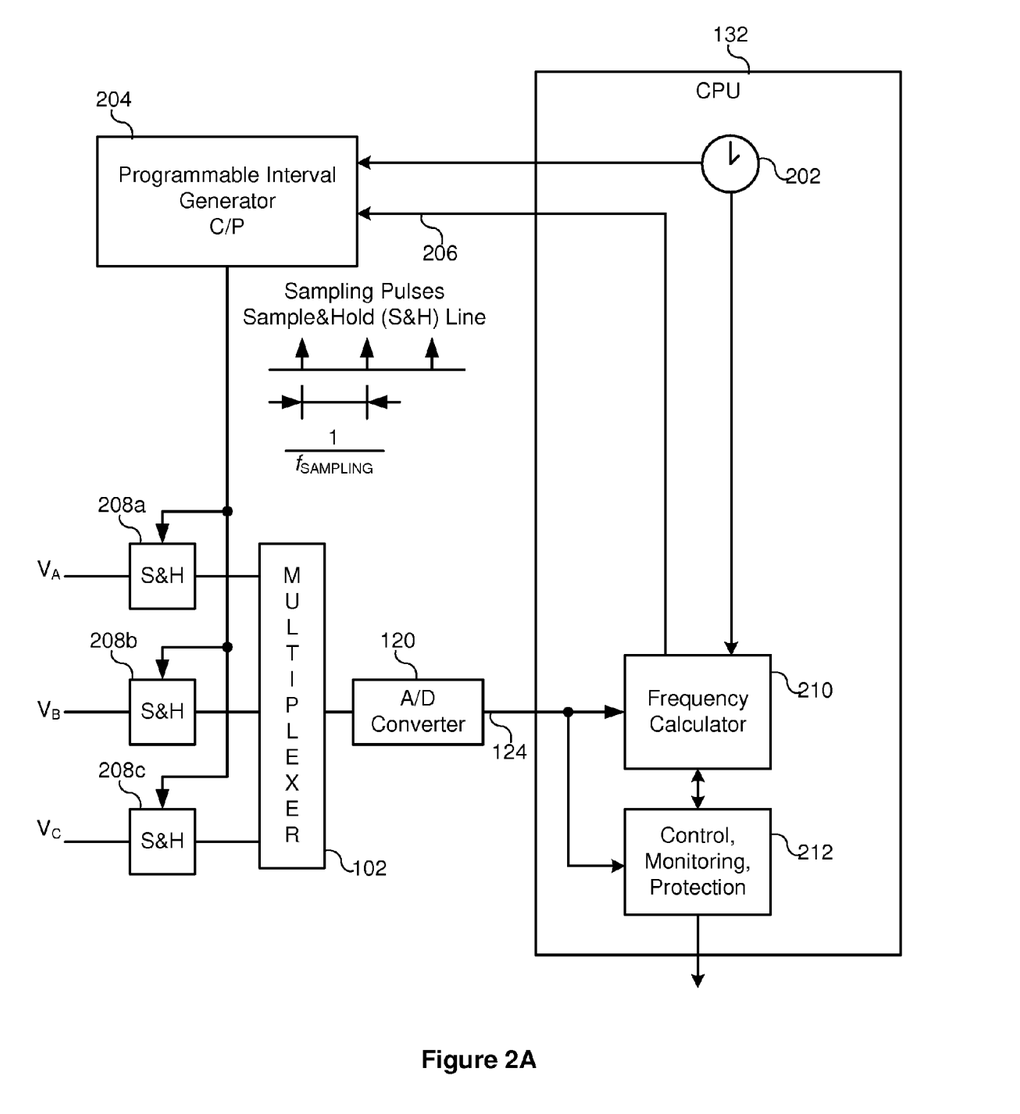
FIGS. 2A and 2B are block diagrams of an intelligent electronic device for sampling a signal at a rate corresponding with a frequency of the signal.

FIG. 2A illustrates a functional block diagram of an IED 100 of FIG. 1. Shown in slightly more detail in FIG. 2A are the components of the IED 100 that assist with sampling, frequency measurement, and frequency tracking. The CPU 132 includes a clock 202, a frequency calculator 210, and certain control, monitoring and protection functions 212. The frequency calculator 210 receives digitized current and voltage signals 124 from the A/D converter 120, with which the Frequency Calculator 210 performs operations to determine the frequency of the monitored electric power system. The Frequency Calculator 210 may also receive a signal from the clock 202 to perform the frequency measurement functions. With the calculated power system frequency, the Frequency Calculator 210 determines the desired sampling frequency of the electric power system, $f_{SAMPLING}$. The Frequency Calculator 210 directs the Programmable Interval Generator 204 to sample according to the sampling frequency, $f_{SAMPLING}$. In one example, the Frequency Calculator 210 computes a preset count P equal to the clock frequency divided by the required sampling frequency $f_{SAMPLING}$. The Frequency Calculator 210 then supplies the preset count P 206 to the Programmable Interval Generator 204.

Under the direction from the Frequency Calculator 210, the Programmable Interval Generator 204 generates pulses at the frequency corresponding with the sampling frequency, $f_{SAMPLING}$. The sampling pulses are then supplied to the sample-and-hold units 208a, b, c, of the circuits acquiring the analog waveforms. Illustrated in FIG. 2A, the voltage waveforms of the three phases of the electric power system are acquired using, for example, potential transformers (PTs) in communication with the sample-and-hold units 208a, b, c. However, this may be extended to other circuits for acquiring the analog waveforms such as, for example, current waveforms acquired by current transformers (CTs). The sampled analog waveforms are multiplexed by the multiplexer 102, and supplied to the A/D converter 120.

Digitized voltage and/or current signals 124 are also supplied to the control, monitoring, and protection modules 212, which are configured to perform control, monitoring, and/or protection functions and output the resulting instructions and communications.

Figure 2B:
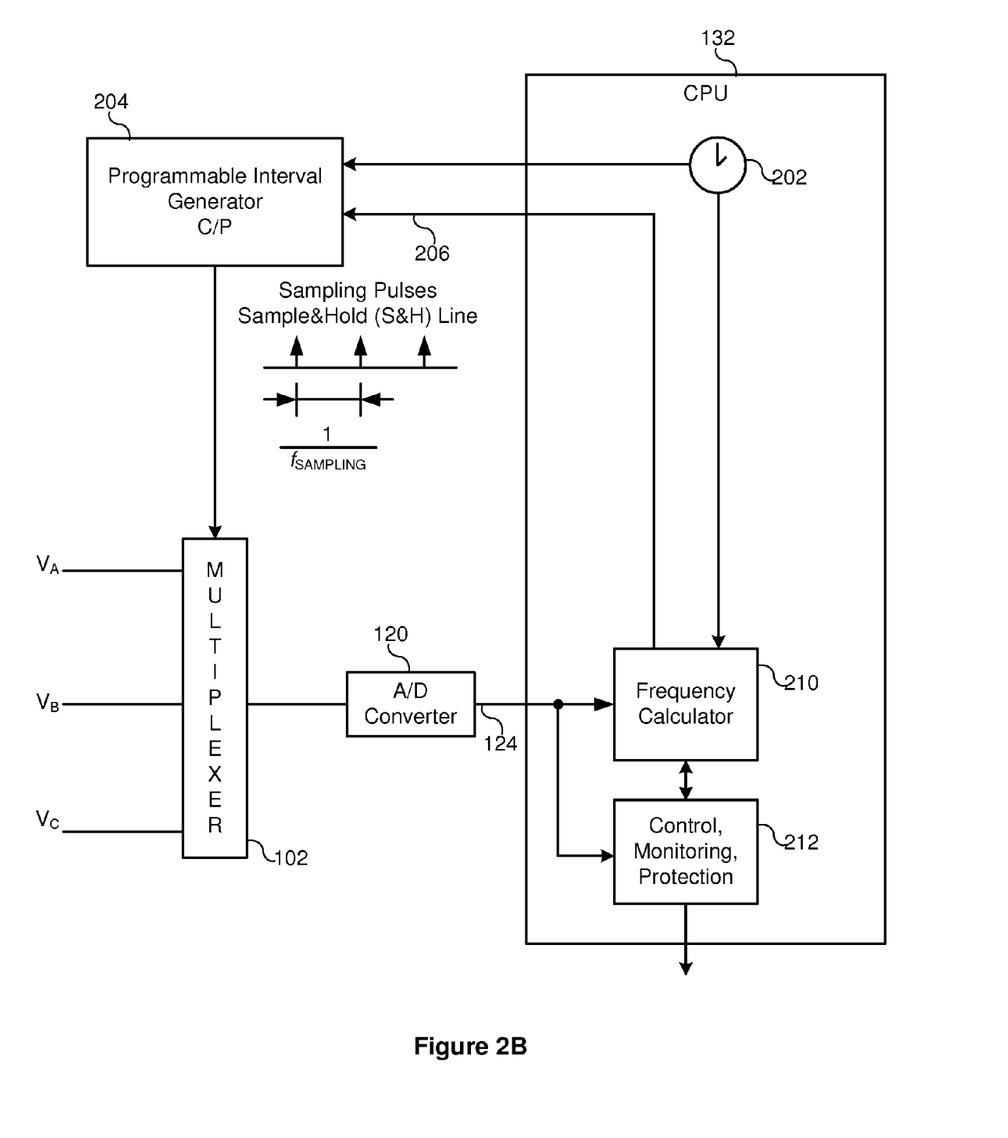

In one example, illustrated in FIG. 2B, the IED 100 does not include sample-and-hold units 208a, b, c. Instead, firmware and/or software is used for the same purpose. For example, the firmware and/or software operating on the CPU 132 may include algorithms for accounting for latency between sampled channels. In this example, the Programmable Interval Generator 204 generates pulses at the frequency corresponding with the sampling frequency, $f_{SAMPLING}$, and supplies the pulses to the multiplexer for acquiring the required samples of the waveforms.

III. Frequency Calculation

As described above, the IED 100 may perform frequency calculations in a CPU 132 or equivalent. In one example, the frequency calculations are performed in a Frequency Calculator 210 which may be computer instructions stored in a digital format and executed on a CPU 132 or its equivalent. IEDs 100 often include several control, monitoring, and protection modules operating on the CPU 132, which make certain quantities available to other modules of the CPU 132. Various of these quantities may be beneficial to the Frequency Calculator 210 for calculating the frequency of the monitored electric power system.

In one example, a module operating on the CPU 132 may calculate instants of zero-crossings of an electric power system waveform such as a voltage waveform or a current waveform. Using the instants of the zero-crossings of the electric power system waveform, the Frequency Calculator 210 may be capable of determining the frequency of the electric power system, $f_{SIGNAL}$ using:

$$f_{SIGNAL} = \frac{1}{2 \cdot (T_{ZC2} - T_{ZC1})} \quad (3.1)$$

where:
$T_{ZC1}$ is a time of a first zero crossing; and,
$T_{ZC2}$ is a time of the subsequent zero crossing.

Alternatively, the CPU may operate a module that calculates times of peaks of a signal waveform. The Frequency Calculator 210 may similarly use the times of signal peaks to calculate the signal frequency $f_{SIGNAL}$.

In yet another example, the Frequency Calculator 210 may use a positive-sequence phasor ("PSP"), such as a positive sequence voltage phasor or a positive sequence current phasor, to calculate the signal frequency $f_{SIGNAL}$. Although the following example describes a technique of calculating the signal frequency $f_{SIGNAL}$ using the positive-sequence voltage phasor, the positive-sequence current phasor may be calculated and used in place of the positive-sequence voltage phasor. In a three-phase electrical power system, phasors for each phase are used to calculate the positive-sequence phasor. For example, the positive-sequence voltage phasor is calculated using the voltage phasors from each phase using:

$$V_1 = \frac{1}{3}(V_A + aV_B + a^2 V_C) \quad (3.2)$$

where:
$V_1$ is the positive-sequence voltage phasor;
$V_A$, $V_B$, and $V_C$, are voltage phasors for each of the three phases at a particular point on the electrical power system; and
a is the complex number $a = 1 \angle 120°$.

The three voltage (or current) waveforms are sampled at a rate of N samples-per-cycle. If the waveforms are acquired at a particular sampling frequency $f_{SAMPLING}$, a difference $\Delta f$ representing a difference between the sampling frequency $f_{SAMPLING}$ and a sampling frequency that corresponds with the signal frequency $f_{SIGNAL}$ using:

$$\Delta f = f_{SIGNAL} - \frac{f_{SAMPLING}}{N} \quad (3.3)$$

When $\Delta f$ is zero the sampling frequency $f_{SAMPLING}$ corresponds directly with the signal frequency $f_{SIGNAL}$. This condition of correspondence between the sampling frequency $f_{SAMPLING}$ and the signal frequency $f_{SIGNAL}$ is also evidenced by the PSP not rotating in the complex plane. When the sampling frequency $f_{SAMPLING}$ and the signal frequency $f_{SIGNAL}$ do not correspond, the PSP will undergo a rotation in the complex plane, the angular speed of which is proportional to the frequency difference $\Delta f$.

The frequency difference $\Delta f$ can be calculated by measuring the angle $\Psi_m$ (in radians) resulting from the PSP rotation over an interval of time $t_m$ using:

$$\Delta f = \frac{\Psi_m}{2\pi t_m} \quad (3.4)$$

Figure 3:
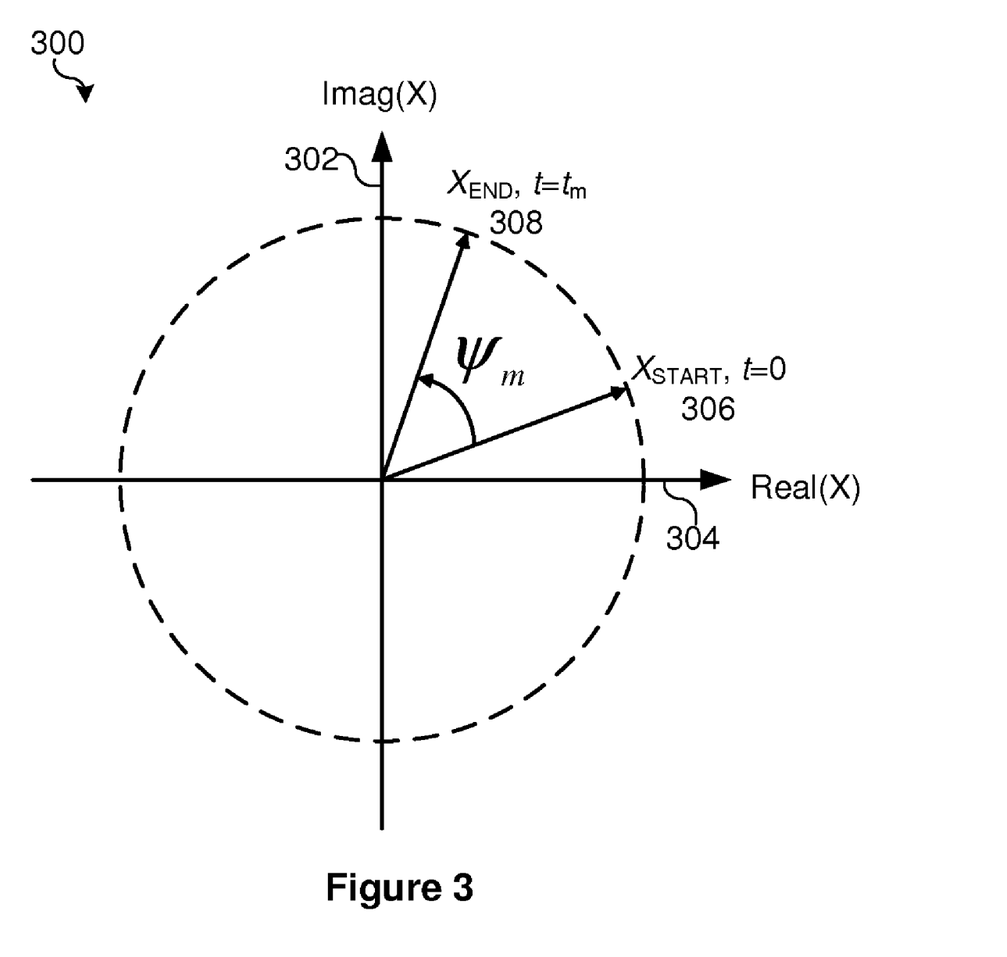
FIG. 3 is a plot of a rotation of a positive sequence phasor.

Equation 3.4 requires the measurement of the angle $\Psi_m$ (in radians) resulting from the PSP rotation over an interval of time $t_m$. FIG. 3 illustrates a plot 300 of the rotation of PSP through the angle $\Psi_m$ from a start time t=0 306 to an end time t=$t_m$ 308 on real 304 and imaginary 302 axis. Positive-sequence phasors are represented as $X_{START}$ as the PSP at time t=0, and $X_{END}$ as the PSP at time t=$t_m$. The angle can be computed using:

$$\Psi_m = a\tan\left[\frac{imag(X_{END})}{real(E_{END})}\right] - a\tan\left[\frac{imag(X_{START})}{real(E_{START})}\right] \quad (3.5)$$

Alternatively, the angle can be computed using:

$$\Psi_m = a\sin\left\{\frac{imag[X_{END} * conj(X_{START})]}{|X_{END}| * |X_{START}|}\right\} \quad (3.6)$$

Using the sampling frequency $f_{SAMPLING}$ and the number of times per cycle, Q, that the angle $\Psi_m$ is calculated (e.g. for calculating the angle $\Psi_m$ every quarter of a cycle, Q=4), the frequency difference $\Delta f$ can be calculated using:

$$\Delta f = \frac{\Psi_m}{2\pi \frac{Q}{f_{SAMPLING}}} \quad (3.7)$$

Once the frequency difference $\Delta f$ is calculated, a measurement of the signal frequency $f_{SIGNAL}$ can be performed using:

$$f_{SIGNAL} = \frac{f_{SAMPLING}}{N} + \Delta f \quad (3.8)$$

or, using Equation 3.7, Equation 3.8 becomes:

$$f_{SIGNAL} = \frac{f_{SAMPLING}}{N} + \frac{\Psi_m}{2\pi \frac{Q}{f_{SAMPLING}}} \quad (3.9)$$

Substituting the value of $\Psi_m$ from Equation 3.6 yields:

$$f_{SIGNAL} = f_{SAMPLING}\left[\frac{1}{N} + \frac{a\sin\left\{\frac{imag[X_{END} * conj(X_{START})]}{|X_{END}| * |X_{START}|}\right\}}{2\pi Q}\right] \quad (3.10)$$

Likewise, substituting the value of $\Psi_m$ from Equation 3.5 yields:

$$f_{SIGNAL} = f_{SAMPLING}\left[\frac{1}{N} + \frac{a\tan\left[\frac{imag(X_{END})}{real(X_{END})}\right] - a\tan\left[\frac{imag(X_{START})}{real(X_{START})}\right]}{2\pi Q}\right] \quad (3.11)$$

Thus, using the PSP from, for example, the control, monitoring, and protection block 212, (or by calculating the PSP itself) the Frequency Calculator 210 is capable of calculating a difference between the sampling frequency $f_{SAMPLING}$ and a sampling frequency that corresponds with the signal frequency $f_{SIGNAL}$. Using the calculated signal frequency $f_{SIGNAL}$, the Frequency Calculator 210 can then calculate the corresponding sampling frequency $f_{SAMPLING}$ and adjust the sampling frequency $f_{SAMPLING}$ of the electric power signal. In one example, the sampling frequency $f_{SAMPLING}$ is not adjusted instantaneously to its new value upon detecting a frequency difference, but is instead delayed. Also, the change in the sampling frequency $f_{SAMPLING}$ can be buffered by implementing a filtering effect. Once the measurement of the signal frequency $f_{SIGNAL}$ is performed, the new sampling frequency $f_{SAMPLING\_NEW}$ can be calculated using:

$$f_{SAMPLING\_NEW} = M * f_{MEASURED} + (N - M) \cdot \frac{f_{SAMPLING\_OLD}}{N} \quad (3.12)$$

where:

$f_{SAMPLING\_NEW}$ is the new sampling frequency;
$f_{MEASURED}$ is the measured signal frequency;
$f_{SAMPLING\_OLD}$ is the old sampling frequency; and,
M is an integer number introducing a filtering effect in the establishment of the new sampling frequency. Typically, M is equal to 10 when N is equal to 16. As explained latter, M could take a higher value in circumstances where a rapid change in the sampling frequency is desired.

IV. Independent Frequency Measurement and Tracking

The present disclosure introduces a method for measuring the signal frequency $f_{SIGNAL}$ and changing the sampling frequency $f_{SAMPLING}$ to result in a frequency tracking where the frequency measurement is independent of the change in sampling frequency. The method implements certain intervals during the stages of frequency measuring, corresponding sampling frequency calculation, and changing of the sampling frequency. In general, the method includes a settling interval during which no signal frequency $f_{SIGNAL}$ is calculated, thus the PSP is allowed to settle. The settling interval is followed by a measuring interval during which the signal frequency $f_{SIGNAL}$ is calculated, the new sampling frequency $f_{SAMPLING\_NEW}$ is calculated and the sampling frequency $f_{SAMPLING}$ is updated with the new sampling frequency $f_{SAMPLING\_NEW}$. The method then restarts with the settling interval during which the PSP is again allowed to settle. In one embodiment, where the PSP is used to calculate $\Delta f$, the PSP, angle $\Psi_m$, frequency difference $\Delta f$, measured frequency $f_{MEASURED}$, and signal frequency $f_{SIGNAL}$ may be calculated during the measuring interval.

Figure 4A:
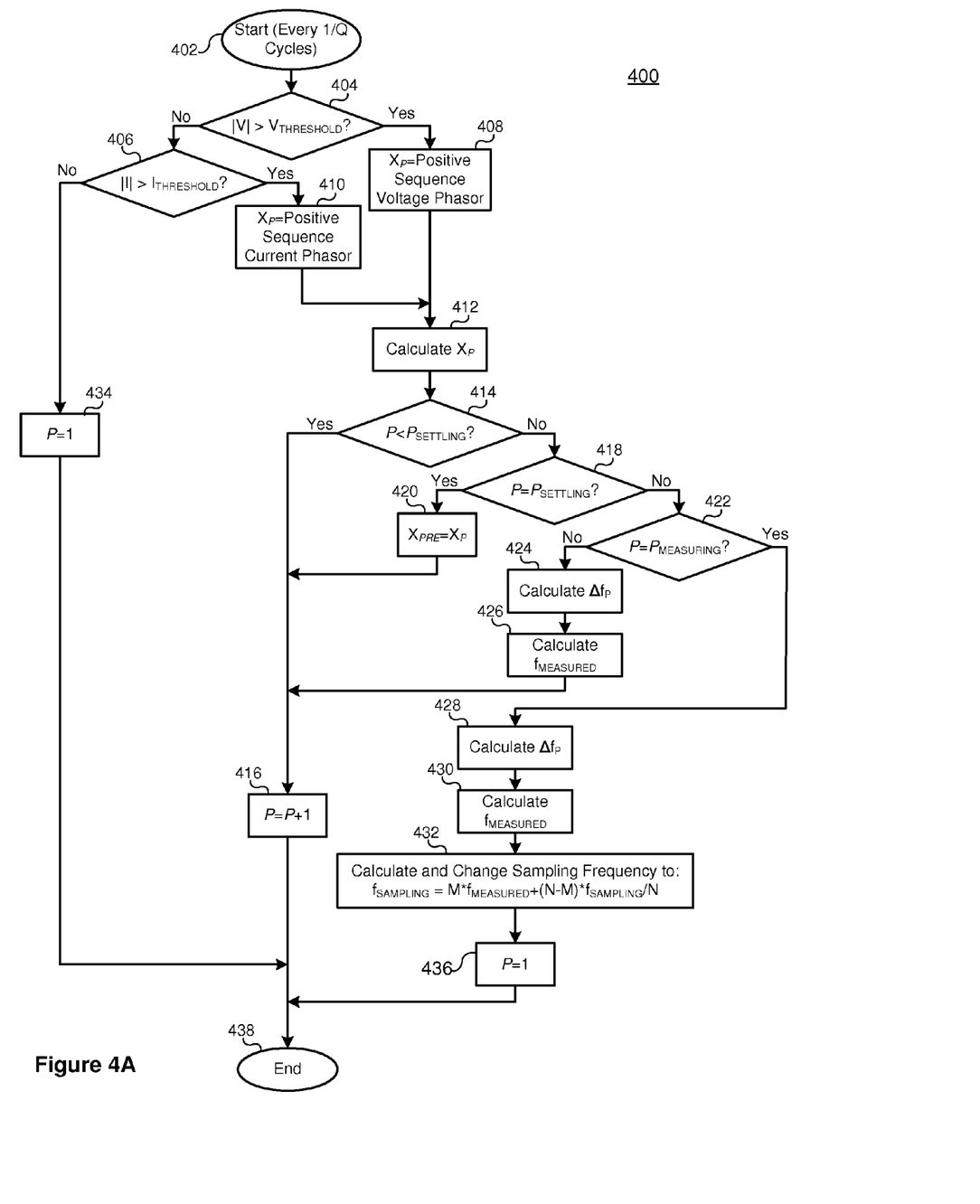
FIG. 4A is a flow chart of a method for measuring a frequency of a signal and modifying a sampling rate of the signal.

FIG. 4A illustrates a flow chart of a method for independent frequency measurement and tracking 400 that may be carried out by an IED according to the above general description. The method 400 is configured to operate upon an interrupt scheduled at every 1/Q of a cycle. For example, for the method to run each quarter of a cycle, Q is set to 4. The method starts 402 (at each 1/Q cycles) with determining whether the positive-sequence phasor used would be the positive-sequence voltage phasor or the positive-sequence current phasor. To this end, the method determines whether the absolute value of the voltage waveform exceeds a predetermined threshold 404. If the absolute value of voltage does exceed the threshold, then the method uses the positive-sequence voltage phasor ($X_P$ is set to be the positive-sequence voltage phasor) 408. If, however, the absolute value of voltage does not exceed the threshold, then the method determines whether the absolute value of the current waveform exceeds a predetermined threshold 406. If so, then the method uses the positive-sequence current phasor ($X_P$ is set to be the positive-sequence current phasor) 410. If, however, neither the absolute value of voltage 404 nor the absolute value of current 406 exceed the respective predetermined thresholds, then the measurement interval P is set to one 434 and the method ends 438 until the next interrupt 402.

After it is determined whether the positive-sequence phasor $X_P$ (where subscript "P" is the measuring increment where the positive-sequence phasor is calculated) is set to the positive-sequence current phasor or the positive-sequence voltage phasor, the positive sequence phasor $X_P$ is calculated

412. On the first measurement during the settling interval, subscript "P" is one. The method is configured to increment P by one count before each subsequent calculation of $X_P$.

Once the positive-sequence phasor $X_P$ is calculated 412, the method determines whether the system is within the settling interval. This is determined by comparing the measurement increment P against $P_{SETTLING}$. The value for $P_{SETTLING}$ is selected to provide sufficient time for $X_P$ to settle before frequency measurements are performed again. If the value of P is less than $P_{SETTLING}$ 414, then the method proceeds to increment P by one count 416, and ends 438 until the next interrupt, when it starts 402 and proceeds to calculate the next $X_P$ 412. If, however, P is not less than $P_{SETTLING}$ 414, then the method proceeds to determine whether P is equal to $P_{SETTLING}$ 418. If so, then the present value of $X_P$ is stored as $X_{PRE}$ 420, marking the first position of the positive-sequence phasor for later determination of the angle $\Psi_m$. The method then proceeds to increment P by one count 416, and ends 438 until the next interrupt, when it starts 402 and proceeds to calculate the next $X_P$ 412.

Returning now to step 418, if P is not equal to $P_{SETTLING}$ 418 (it must be greater than $P_{SETTLING}$), then the method proceeds to determine if P is equal to $P_{MEASURING}$ 422. The value for $P_{MEASURING}$ is selected such that values for the positive-sequence phasor and the angle calculated during the measuring interval are of a sufficient quantity to accurately measure the frequency difference $\Delta f$ such that a new sampling frequency $f_{SAMPLING\_NEW}$ may be accurately determined.

In one example, the method is interrupted every quarter cycle (Q=4), the settling interval is set to 1.5 cycles ($P_{SETTLING}$=1.5×Q=6), and the measuring interval is set to 1.5 cycles ($P_{MEASURING}$=$P_{SETTLING}$+1.5×Q=12). In such an example, the new sampling frequency $f_{SAMPLING\_NEW}$ may be determined in three power-system cycles.

Returning to step 422, if P is not equal to $P_{MEASURING}$ (P must be between $P_{SETTLING}$ and $P_{MEASURING}$), then the frequency difference at that interval $\Delta f_P$ is calculated 424 according to the equations in section III, and the measured frequency $f_{MEASURED}$ is calculated 426. The measured frequency $f_{MEASURED}$ may be calculated according to a number of possible algorithms. One possible algorithm is to calculate the measured frequency $f_{MEASURED}$ using an Olympic filter. The Olympic filter is designed to take the average of a set of signal frequency $f_{SIGNAL}$ calculations, the set including all of the signal frequencies $f_{SIGNAL}$ calculated during the measurement interval less the maximum and the minimum calculated signal frequencies $f_{SIGNAL}$. One way of implementing the Olympic filter is to determine and store the signal frequency at each increment P during the measuring interval $f_{SIGNAL\_P}$ and to calculate the measured frequency $f_{MEASURED}$ using the stored calculated signal frequencies $f_{SIGNAL\_P}$. Thus, step 426 simply calculates and updates the measured frequency $f_{MEASURED}$ at each increment. Once the measured frequency $f_{MEASURED}$ is determined, the method increases the increment P by one 416 and ends 438 until the next interrupt, when it starts 402 and proceeds to calculate the next $X_P$ 412.

If the increment P in 422 is equal to $P_{MEASURING}$, then the method proceeds to calculate the final frequency difference $\Delta f_P$ during the measuring interval 428 and to calculate the measured frequency $f_{MEASURED}$ 430. The method then updates the sampling frequency $f_{SAMPLING}$ using the calculated measured frequency $f_{MEASURED}$, the numbers of samples per cycle N, the variable M, and the old sampling frequency $f_{SAMPLING}$ 432. Once the sampling frequency $f_{SAMPLING}$ is updated, the method resets increment P to one 436, ends 438, returning to start 402 at the next interrupt. Note that certain steps and calculations may be skipped or removed for a calculation of the signal frequency $f_{SIGNAL}$ using other means than the PSP rotation, such as peak-to-peak times, zero-crossing-to-zero-crossing times, or the like, described in some detail in the discussion of FIG. 4B.

Figure 4B:
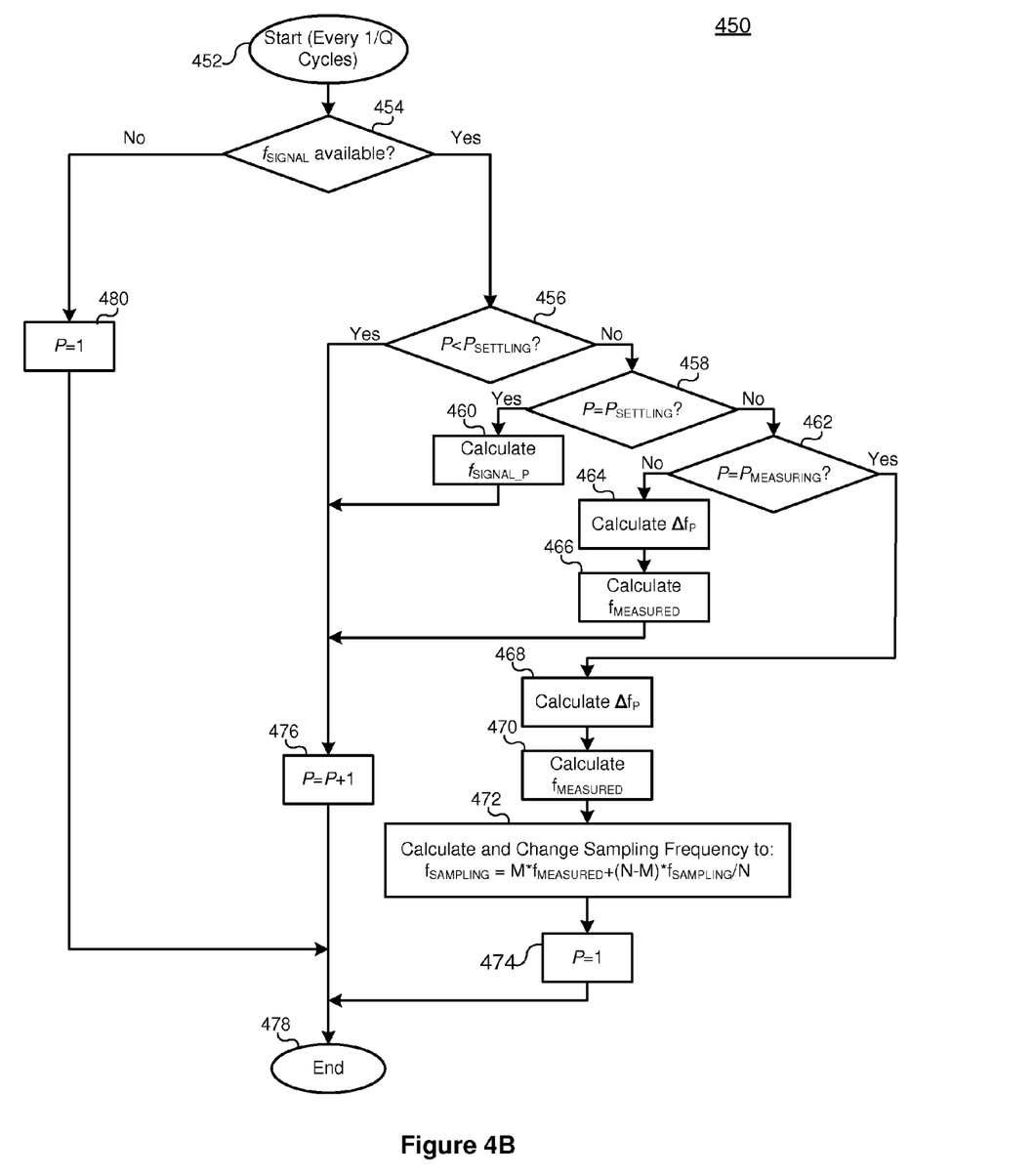
FIG. 4B is another flow chart of a method for measuring a frequency of a signal and modifying a sampling rate of the signal.

FIG. 4B illustrates a flow chart of a method for independent frequency measurement and tracking 450 that may be carried out by an IED according to the above general description without the calculation of PSP, but instead using another form of calculating the signal frequency. For example, the method 450 may use a peak-to-peak detector, a zero-crossing detector, or the like to calculate the signal frequency. Furthermore, the method in FIG. 4B may use a signal from a generator indicating the signal frequency. A generator may include, for example, a measurement of the frequency of rotation of the generator. The frequency of rotation may be used to calculate an electrical frequency of the generator using the number of poles of the generator. Such apparatuses and methods are described in U.S. patent application Ser. No. 12/247,866 naming Edmund O. Schweitzer, III and David E. Whitehead as inventors, which is herein incorporated by reference in its entirety.

As with FIG. 4A, the method 450 is configured to operate upon an interrupt scheduled at every 1/Q of a cycle. For example, for the method to run each quarter of a cycle, Q is set to 4. The method starts 452 (at each 1/Q cycles) with determining whether the measurement of calculation of the signal frequency $f_{SIGNAL}$ is available 454. If not, the method resets the interval counter P to one 480 and ends 478 until the next interrupt. If the signal frequency $f_{SIGNAL}$ is available, the method proceeds to the settling interval by determining whether the interval counter P is less than the $P_{SETTLING}$ 456, then the method proceeds to increment P by one count 476, and ends 478 until the next interrupt, when it starts 452.

If interval counter P is not less than $P_{SETTLING}$ 456, then the method 450 then proceeds to determine if the interval counter P is equal to $P_{SETTLING}$ 458. If yes, then the method determines the signal frequency at count P $f_{SIGNAL\_P}$ 460 and proceeds to increment P by one count 476, and ends 478 until the next interrupt, when it starts 452.

If the interval counter P is equal to $P_{SETTLING}$ 458, the method determines whether the interval counter P is equal to $P_{MEASURING}$ 462. If not, then the method proceeds to calculate a frequency difference $\Delta f_P$ 464 using, for example, Equation 3.3, calculate $f_{MEASURED}$ 466 as described above, and proceeds to increment P by one count 476, and ends 478 until the next interrupt, when it starts 452.

If the interval counter is equal to $P_{MEASURING}$ 462, then the method proceeds to calculate a frequency difference $\Delta f_P$ 468 using, for example, Equation 3.3, and calculate $f_{MEASURED}$ 470 as described above. The method then proceeds to calculate and change the sampling frequency 472. Increment counter P is then reset to one 474 and the method ends 478 until the next interrupt when it starts 452.

Figure 5:
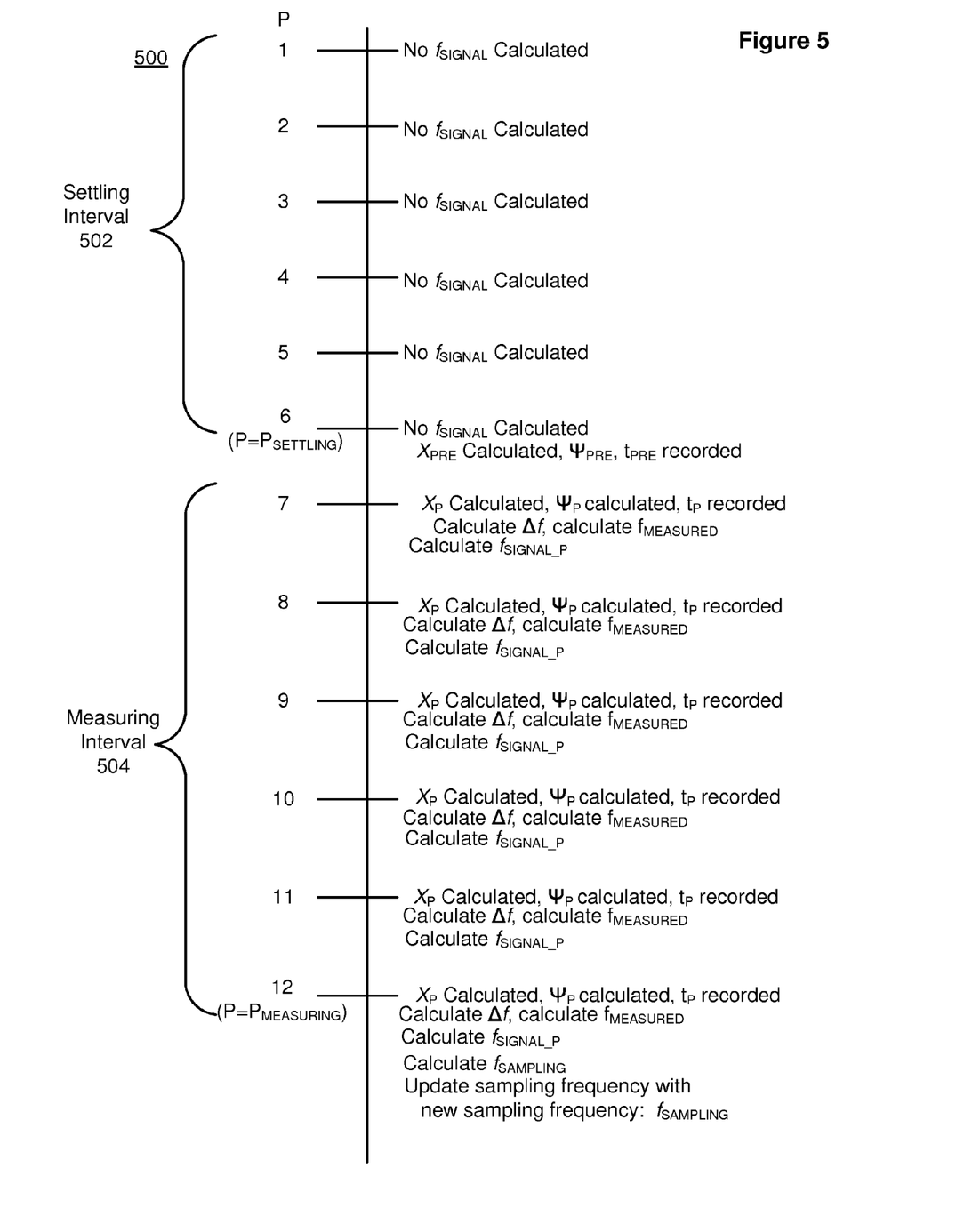
FIG. 5 is a diagram showing the settling and measuring intervals of the systems and methods described herein; and, FIG. 6 is a plot of a step increase in signal frequency and the sampling frequency response of an apparatus following a method described herein.

FIG. 5 illustrates an implementation 500 of the method described in conjunction with FIG. 4A, where the settling interval 502 is set to be six increments P and the measuring interval 504 is set to be six increments P. As is shown, during the settling interval 502, the method interrupts at each increment P. However, for the first six increments P, no signal frequency $f_{SIGNAL}$ is calculated. On the sixth increment P, the starting position of the positive-sequence phasor $X_{PRE}$ is calculated, the start angle $\Psi_{PRE}$ is calculated and recorded, and a start time $t_{PRE}$ is recorded (306 of FIG. 3). During the measuring interval 504 (increments P 7-12), the positive-sequence phasors $X_P$ are calculated at each increment, the angle differences $\Psi_P$ are calculated, the time $t_P$ is recorded, the frequency difference $\Delta f_P$ is calculated, the measured frequency $f_{MEASURED}$ is calculated, and the signal frequency $f_{SIGNAL\_P}$ is calculated and recorded.

Finally, at the final increment P, the sampling frequency $f_{SAMPLING}$ is updated with the new calculated sampling frequency $f_{SAMPLING}$, and the method starts over sampling at the new sampling frequency $f_{SAMPLING}$ with another settling interval 502. Thus, the sampling frequency is only changed once during the 12 increments P of the settling interval and the measuring interval.

Figure 6:
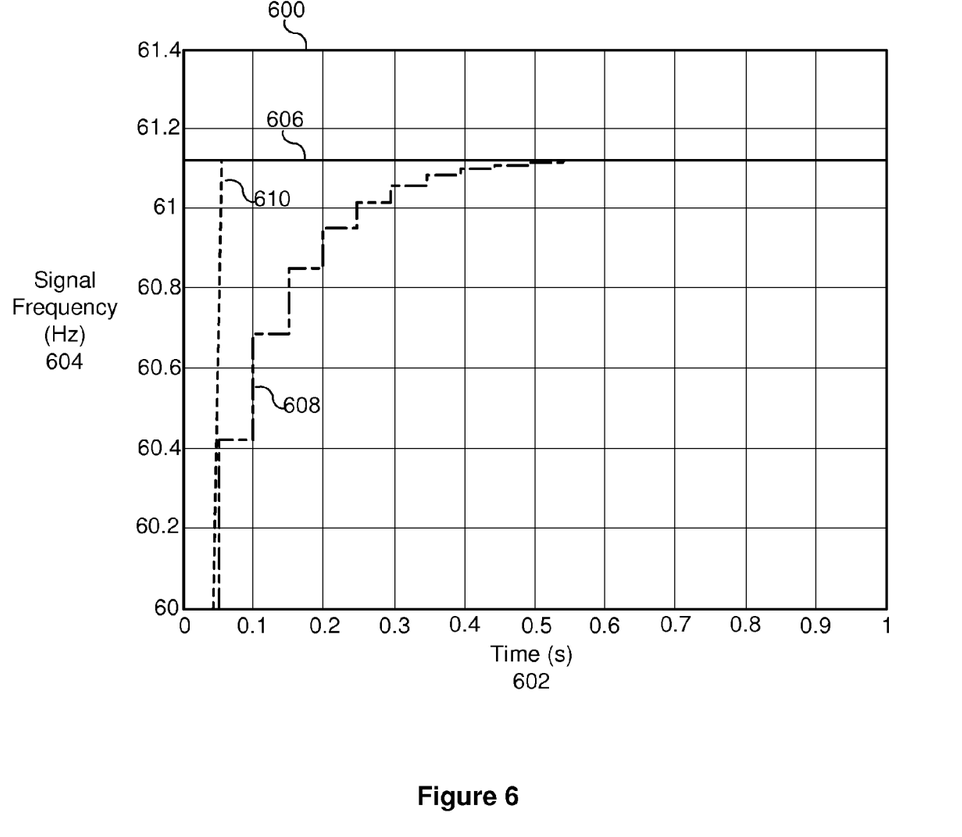

The above-described method may be implemented in an IED 100 such as the IED illustrated in FIG. 1 and configured to monitor a three-phase electric power system. FIG. 6 illustrates a response of the method implemented on an IED and in response to a step change in frequency. As can be seen in FIG. 6 is a plot 600 of signal frequency and response in Hz 604 on the y-axis and time in seconds 602 along the x-axis. The signal frequency 606 is stepped up from 60.000 Hz to 61.125 Hz at time t=0 seconds. Line 610 shows the calculated measured frequency response of the present disclosure where the number of samples-per-cycle N is 16, the interrupt is set at once every quarter-cycle (Q=4), the settling interval is 1.5 cycles ($P_{SETTLING}$=6), and the measuring interval is set at 1.5 cycles ($P_{MEASURING}$=12). At 60 Hz, the expected time for the 1.5 cycle settling interval is 0.025 seconds. Likewise, at 60 Hz, the expected time for the 1.5 cycle measuring interval is 0.025 seconds. Thus, the method is expected to calculate the measured frequency and the sampling frequency for the stepped-up signal frequency at 0.05 seconds. As can be seen in the plot 600 of FIG. 6, the result is that the measured frequency 610 reaches the actual signal frequency at around 0.05 seconds as is expected (the measured frequency is calculated after the settling and measuring intervals, each of around 0.025 seconds).

Line 608 of FIG. 6 illustrates the sampling frequency $f_{SAMPLING}$ resulting from the step change in frequency and the measured frequency. It can be seen that a step up in the sampling frequency $f_{SAMPLING}$ is made following each set of a settling interval and a measuring interval (about every 3 cycles, or 0.05 seconds). The sampling frequency $f_{SAMPLING}$ does not track along the measured frequency $f_{MEASURED}$ 610 because the sampling frequency is updated according to Equation 3.12 with N=16 and M=6. The sampling frequency corresponds to the measured frequency (and the signal frequency) after about 0.55 seconds. It is also evident from FIG. 6 that the measured frequency and sampling frequency are independent. That is, changes in the sampling frequency do not change the measured frequency.

Various modifications and choices may be made in implementing the method described above. For example, during the measuring interval (from $P > P_{SETTLING}$ through $P = P_{MEASURING}$), the frequency difference $\Delta f$ and the angle $\Psi_P$ can be calculated on an individual increment basis or on a cumulative basis, resulting in the signal frequency $f_{SIGNAL}$ being calculated on an incremental or cumulative basis. For example, the signal frequency $f_{SIGNAL}$ can be calculated on a cumulative basis using either:

$$f_{SIGNAL\_P} = f_{SAMPLING}\left[\frac{1}{N} + \frac{a\sin\left\{\frac{imag[X_P * conj(X_{PRE})]}{|X_P| * |X_{PRE}|}\right\}}{2\pi Q}\right] \quad (4.1)$$

$$f_{SIGNAL\_P} = f_{SAMPLING}\left[\frac{1}{N} + \frac{a\tan\left[\frac{imag(X_P)}{real(X_P)}\right] - a\tan\left[\frac{imag(X_{PRE})}{real(X_{PRE})}\right]}{2\pi Q}\right] \quad (4.2)$$

The signal frequency $f_{SIGNAL}$ can be calculated on an incremental basis using either:

$$f_{SIGNAL\_P} = f_{SAMPLING}\left[\frac{1}{N} + \frac{a\sin\left\{\frac{imag[X_P * conj(X_{P-1})]}{|X_P| * |X_{P-1}|}\right\}}{2\pi Q}\right] \quad (4.3)$$

$$f_{SIGNAL\_P} = f_{SAMPLING}\left[\frac{1}{N} + \frac{a\tan\left[\frac{imag(X_P)}{real(X_P)}\right] - a\tan\left[\frac{imag(X_{P-1})}{real(X_{P-1})}\right]}{2\pi Q}\right] \quad (4.4)$$

Further, as discussed above, the value of M may be modified in Equation 3.12 depending on the desired response of the updated sampling frequency $f_{SAMPLING}$. That is, as the value of M approaches the value of N, the updated sampling frequency $f_{SAMPLING}$ will more quickly approach the sampling frequency $f_{SAMPLING}$ that corresponds to the signal frequency $f_{SIGNAL}$. This may be beneficial in situations where the signal frequency changes rapidly. For example, upon startup of a generator, the signal frequency is expected to increase from 0 Hz to the nominal or rated frequency of the generator. During such startup operations, it may be important for the IED monitoring the generator to closely monitor the signal frequency and to change its sampling frequency quickly as the signal frequency from the generator changes. In one example, the N is set to 16 samples per cycle and M is set to 15 during startup of the generator. A startup condition of a generator may be detected using the method described herein. That is, the number of times that the frequency difference $\Delta f$ exceeds a predetermined threshold may be tracked. If the number of times that the change in frequency $\Delta f$ exceeds a predetermined threshold within one measuring interval, then the method sets M to a higher value (e.g. 15). Otherwise, the value of M remains at its initial value (e.g. 10).

Further, the method may be set to limit the amount by which the sampling frequency $f_{SAMPLING}$ may be changed in each step. For example, the method may allow a maximum of 5 Hz as the change from the old sampling frequency to the new sampling frequency. This limit may be beneficial for restricting the response of the sampling frequency $f_{SAMPLING}$ change during abnormal and transient frequency excursions. Again, this limit may be modified depending on how quickly and/or consistently the signal frequency $f_{SIGNAL}$ is changing. For example, this limit may be increased for the startup period of a generator.

Regardless of the manner in which the signal frequency $f_{SIGNAL}$ is calculated (e.g. using positive-sequence voltage phasors, positive-sequence current phasors, a zero-crossing detector, a peak detector, a signal from a generator, and the like), the method avoids measuring the signal frequency $f_{SIGNAL}$ during the settling period, which follows the measuring period and updating of the sampling frequency $f_{SAMPLING}$.

Further, the frequency measurement and tracking of the present disclosure may limit the range of frequencies that may be measured and sampled to within a predetermined range of frequencies. That is, if the signal frequency is below a low frequency threshold, the method may limit the sampling frequency $f_{SAMPLING}$ to sample at a rate corresponding with the low frequency threshold. Likewise, if the signal frequency exceeds an upper frequency threshold, the method may limit the sampling frequency $f_{SAMPLING}$ to sample at a rate corresponding with the upper frequency threshold. For example, the method may include a lower threshold of 10 Hz and an upper threshold of 70 Hz. If the measured signal frequency falls below 10 Hz, the method will not allow the sampling frequency to fall below the sampling frequency corresponding with a 10 Hz signal frequency. Likewise, if the measured signal frequency exceeds 70 Hz, the method will not allow the sampling frequency to exceed the sampling frequency corresponding with a 70 Hz signal frequency.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A method of sampling a signal having a signal frequency using an Intelligent Electronic Device (IED) and determining the signal frequency with a frequency calculator, comprising the steps of:
during a first measuring interval, the IED executing the steps of: sampling the signal at a first sampling rate; determining a first signal frequency from the signal samples; and
calculating a second sampling rate corresponding with the first signal frequency; and,
during a settling interval, the IED executing the step of:
sampling the signal at the second sampling rate without determining signal frequency while the frequency calculator operates within the settling interval.

2. The method of claim 1, further including the step of:
during a second measuring interval:
sampling the signal at the second sampling rate;
determining a second signal frequency from the signal samples; and
calculating a third sampling rate corresponding with the second signal frequency.

3. The method of claim 1, wherein the signal comprises multiple phases, and the method comprises the step of calculating a positive sequence phasor of the signal.

4. The method of claim 3, wherein the positive-sequence phasor comprises a positive-sequence voltage phasor or a positive-sequence current phasor.

5. The method of claim 3, wherein the step of calculating a second sampling rate comprises the steps of:
calculating a first positive-sequence phasor value of the signal at a first time;
calculating a second positive-sequence phasor value of the signal at a second time;
determining a rate of rotation using the first and second positive-sequence phasors; and
calculating a second sampling rate using the rate of rotation.

6. The method of claim 5, wherein the step of calculating a second sampling rate using the rate of rotation comprises:
calculating a frequency difference using the rate of rotation;
calculating a signal frequency using the first sampling rate and the frequency difference; and
calculating the second sampling rate using the calculated signal frequency and the first sampling rate.

7. The method of claim 6, wherein the step of calculating the second sampling rate uses an average signal frequency determined by:
calculating multiple frequency differences during the measuring interval;
calculating multiple signal frequencies using the first sampling rate and the frequency differences; and,
averaging a set of the multiple signal frequencies.

8. The method of claim 6, wherein the second sampling rate is calculated according to:

$$f_{SAMPLING\_NEW} = M * f_{MEASURED} + \frac{(N-M)}{N} * f_{SAMPLING\_OLD}$$

where:
$f_{SAMPLING\_NEW}$ is the second sampling rate;
M is a constant;
N is a constant corresponding to a number of samples per cycle; and,
$f_{SAMPLING\_OLD}$ is the first sampling rate.

9. The method of claim 1, wherein the settling interval comprises from about 0.5 to about 6 signal cycles.

10. The method of claim 1, wherein the settling interval comprises 1.5 signal cycles.

11. The method of claim 1, wherein the first measuring interval comprises from about 0.5 to about 6 signal cycles.

12. The method of claim 1, wherein the first measuring interval comprises 1.5 signal cycles.

13. The method of claim 1, wherein the step of determining a first signal frequency comprises comparing a time between zero crossings of the signal.

14. The method of claim 1, wherein the step of determining a first signal frequency comprises comparing a time between peaks of the signal.

15. A signal sampling device for sampling a signal and determining a signal frequency thereof, comprising:
a sampling circuit of the signal sampling device in communication with the signal for sampling the signal at a sampling rate and providing signal samples; a frequency calculator of the signal sampling device in communication with the sampling circuit, configured to:
determine whether the frequency calculator operates within a settling interval;
determine a signal frequency using the signal samples sampled at a first sampling rate during a measuring interval;
calculate a second sampling rate during the measuring interval; and, communicate the second sampling rate to the sampling circuit during the measuring interval for sampling the signal at the second sampling rate without determining a signal frequency during the settling interval.

16. The signal sampling device of claim 15, wherein the sampling circuit samples at a single rate during the settling interval.

17. The signal sampling device of claim 15, wherein the frequency calculator is further configured to:
determine a frequency of the signal using the signal samples sampled at the second sampling rate during a second measuring interval;
calculate a third sampling rate during the second measuring interval; and,
communicate the third sampling rate to the sampling circuit during the second measuring interval for sampling the signal during the second settling interval.

18. The signal sampling device of claim 15, wherein the signal comprises multiple phases, and the frequency calculator is configured to determine a positive sequence phasor of the signal.

19. The signal sampling device of claim 18, wherein the positive sequence phasor comprises a positive sequence voltage phasor or a positive sequence current phasor.

20. The signal sampling device of claim 18, wherein to calculate a second sampling rate, the frequency calculator is configured to:
- calculate a first positive-sequence phasor of the signal at a first time;
- calculate a second positive-sequence phasor of the signal at a second time;
- determine a rate of rotation using the first and second positive sequence phasors; and
- calculate a second sampling rate using the rate of rotation.

21. The signal sampling device of claim 20, wherein to calculate a second sampling rate using the rate of rotation, the frequency calculator is configured to:
- calculate a frequency difference using the rate of rotation;
- calculate a signal frequency using the first sampling rate and the frequency difference; and
- calculate a second sampling rate using the calculated signal frequency and the first sampling rate.

22. The signal sampling device of claim 21, wherein the frequency calculator is configured to calculate the second sampling rate according to:

$$f_{SAMPLING\_NEW} = M * f_{MEASURED} + \frac{(N-M)}{N} * f_{SAMPLING\_OLD}$$

where:
- $f_{SAMPLING\_NEW}$ is the second sampling rate;
- M is a constant;
- N is a constant corresponding to a number of samples per cycle; and,
- $f_{SAMPLING\_OLD}$ is the first sampling rate.

23. The signal sampling device of claim 21, wherein the frequency calculator is configured to:
- repeat calculations of the frequency difference and the signal frequency;
- calculate an average calculated frequency from the calculated signal frequencies; and
- use the average calculated frequency to calculate the second sampling rate.

24. The signal sampling device of claim 15, wherein the settling interval comprises from about 0.5 to about 3 signal cycles.

25. The signal sampling device of claim 15, wherein the settling interval comprises 1.5 signal cycles.

26. The signal sampling device of claim 15, wherein the measuring interval comprises from about 0.5 to about 3 signal cycles.

27. The signal sampling device of claim 15, wherein the measuring interval comprises 1.5 signal cycles.

28. The signal sampling device of claim 15, wherein the frequency calculator is configured to determine the first signal frequency based on a time between zero crossings of the signal.

29. The signal sampling device of claim 15, wherein the frequency calculator is configured to determine the first signal frequency based on a time between peaks of the signal.

30. A system for determining a frequency of an electric power signal of an electric power system and modifying a sampling rate of the signal, comprising:
- an intelligent electronic device (IED) in communication with the electric power system, wherein the IED is configured to sample the signal, determine frequency of the signal, and modify the sampling rate of the signal, wherein the IED comprises a non-transitory storage medium comprising computer readable program code to cause the IED to perform a method, comprising;
- during a first measuring interval:
- sampling the signal at a first sampling rate; determining a first signal frequency from the signal samples with a frequency calculator; and calculating a second sampling rate corresponding with the first signal frequency; and, during the settling interval, sampling the signal at the second sampling rate without determining a signal frequency while the frequency calculator operates within the settling interval.

31. The system of claim 30, wherein the signal comprises three phases, and wherein the step of calculating a second sampling rate comprises the steps of:
- calculating a first positive-sequence phasor value of the signal at a first time;
- calculating a second positive-sequence phasor value of the signal at a second time;
- determining a rate of rotation using the first and second positive-sequence phasor values;
- calculating a frequency difference using the rate of rotation;
- calculating a signal frequency using the first sampling rate and the frequency difference; and
- calculating a second sampling rate using the calculated signal frequency and the first sampling rate.

* * * * *